United States Patent [19]

K. O. Kenneth et al.

[11] Patent Number: 5,028,977
[45] Date of Patent: Jul. 2, 1991

[54] MERGED BIPOLAR AND INSULATED GATE TRANSISTORS

[75] Inventors: K. O. Kenneth, Cambridge; Hae-Seung Lee, Watertown; L. Rafael Reif, Newton, all of Mass.

[73] Assignee: Massachusetts Institute of Technology, Cambridge, Mass.

[21] Appl. No.: 367,387

[22] Filed: Jun. 16, 1989

[51] Int. Cl.[5] .................... H01L 27/02; H01L 29/72; H01L 29/10
[52] U.S. Cl. ...................................... 357/43; 357/42; 357/35; 357/23.4
[58] Field of Search ..................... 357/43, 42, 35, 23.4

[56] References Cited

U.S. PATENT DOCUMENTS

| 4,344,081 | 8/1982 | Pao et al. | 357/43 |
| 4,717,686 | 1/1988 | Vaterstetten et al. | 437/56 |
| 4,737,472 | 4/1988 | Schaber et al. | 437/59 |
| 4,739,386 | 4/1988 | Tanizawa | 357/43 |
| 4,851,889 | 7/1989 | Matsuzaki | 357/23.4 |
| 4,868,135 | 9/1989 | Ogura et al. | 357/43 |

OTHER PUBLICATIONS

"High Speed BICMOS VLSI Technology with Buried Twin Well Structure", *IEDM Tech. Digest*, 1985, Washington, D.C., pp. 423–426.
"A 2 μm BICMOS Process with Fully Optimized MOS and Bipolar Transistors", ECS 171st Society Meeting, vol. 87-1) May, 1987, Philadelphia, Pa., pp. 407–408.

*Primary Examiner*—Rolf Hille
*Assistant Examiner*—Wael Fahmy
*Attorney, Agent, or Firm*—Hamilton, Brook, Smith & Reynolds

[57] ABSTRACT

A vertical bipolar transistor is formed along with an IGFET transistor in a process in which the bipolar transistor collector, base and emitter structure is formed in the body of a semiconductor mesa-like structure while the IGFET transistor is formed in and along one of the sidewalls of the structure. Source and drain regions are formed in the structure by ion-implantation using a polysilicon gate electrode formed over a gate insulator on the sidewall as a self-aligning mask.

22 Claims, 10 Drawing Sheets

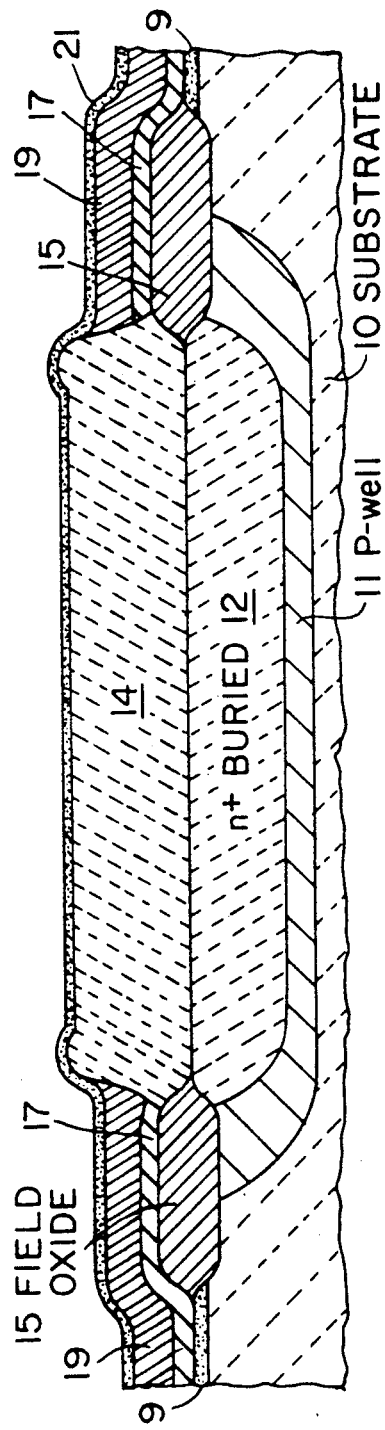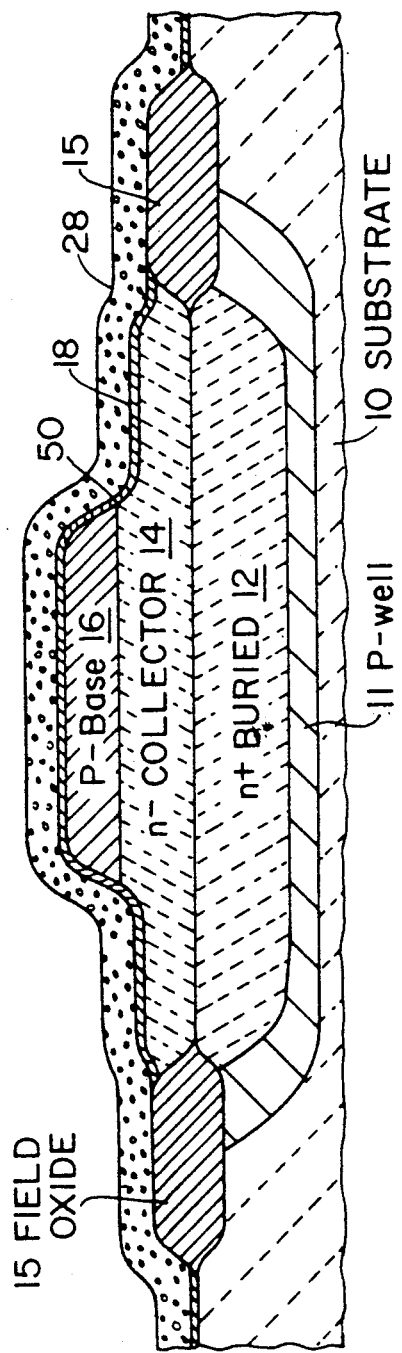

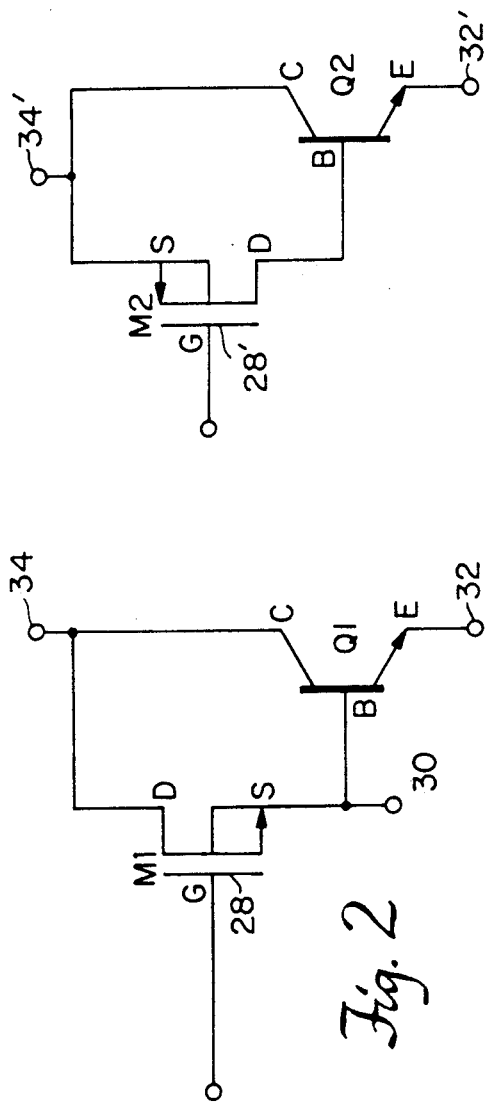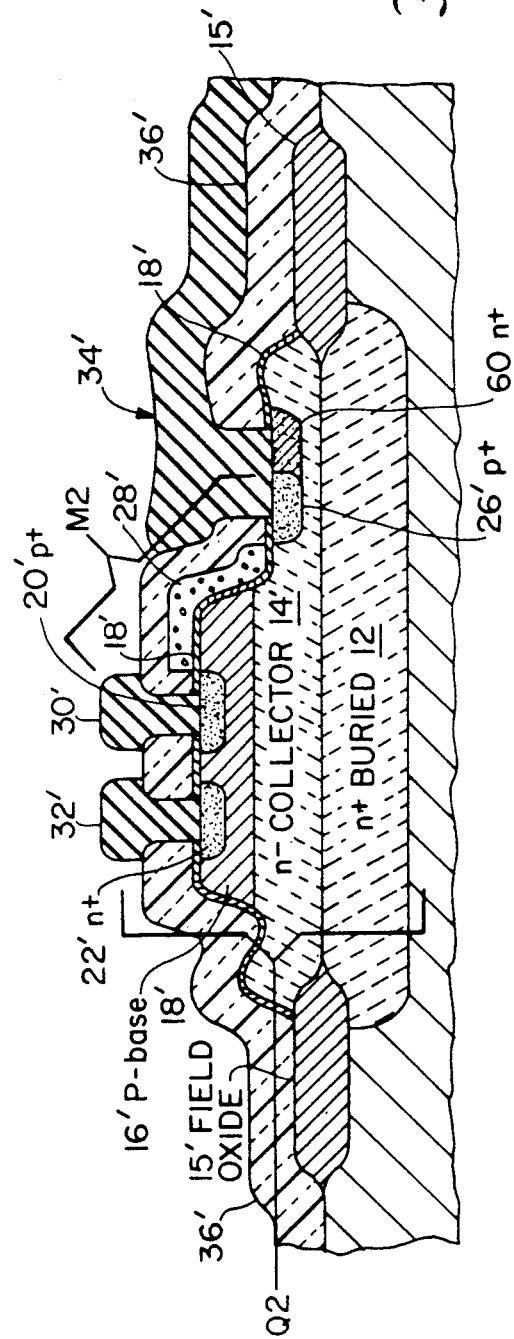

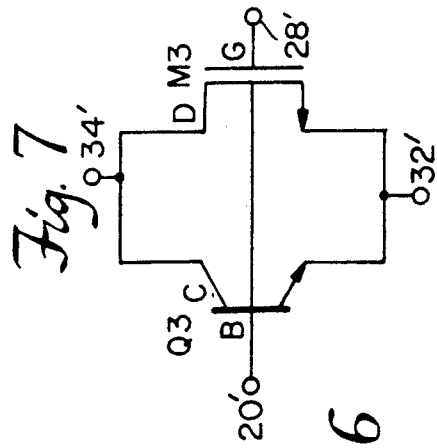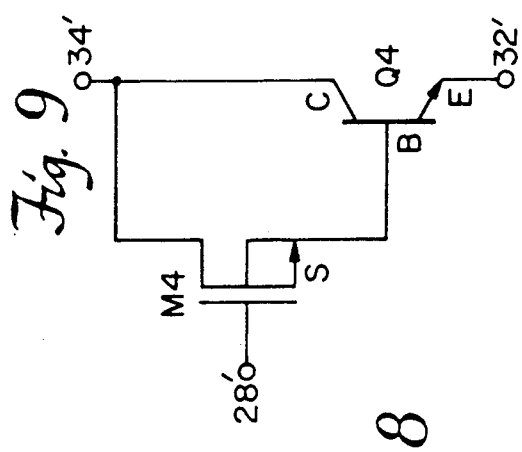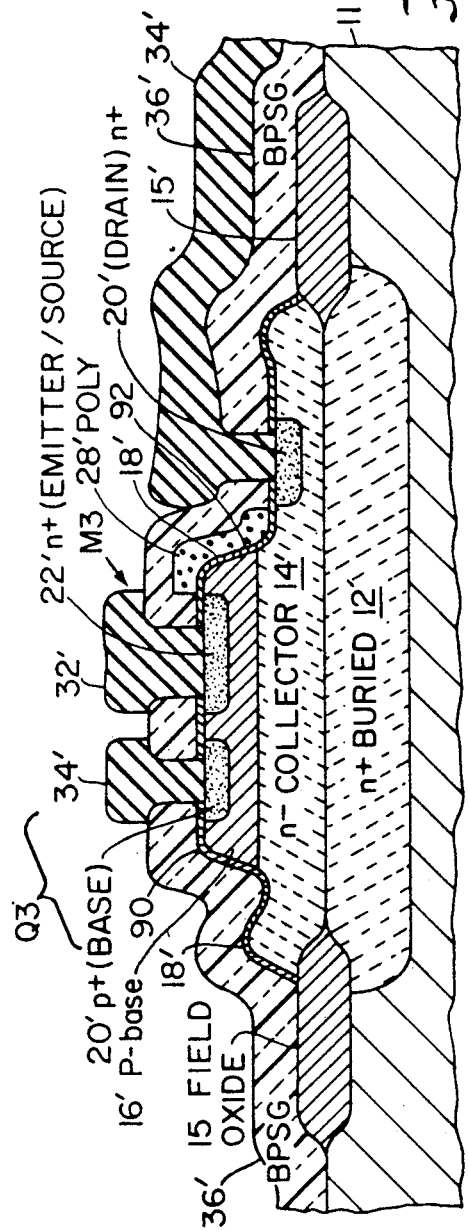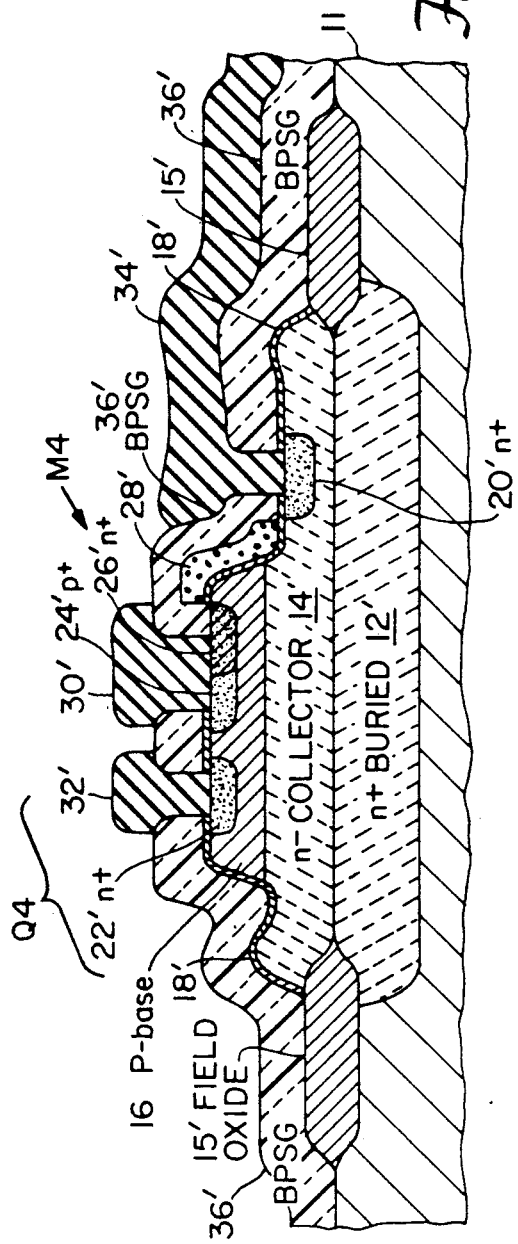

MERGED BIPOLAR AND INSULATED GATE TRANSISTORS

BACKGROUND ART

This invention relates to insulated-gate-field-effect-transistors (IGFETS) and/or metal-oxide-semiconductor field-effect-transistors (MOSFETS) and bipolar transistors and the merger of the two technologies to fabricate both on a single substrate. More specifically, the present invention involves the merger of IG FET's with bipolar transistors by a process in which the technical advantages of each technology complements the other.

In an IGFET, drain and source regions are formed on either side of a channel region. The channel region underlies a gate electrode which is insulated from the channel by an insulating layer, such as $SiO_2$. The MOS is a specie of IGFET wherein the gate electrode is formed of metal.

One of the major advantages of combining bipolar and MOS and IGFET technology is that the strengths of bipolar and IGFET technologies can be integrated into a single chip to obtain a higher performance and a wider range of functions.

IGFET Digital Circuits have high packing density and low standby power which are important features for large systems. Because IGFET transistors are coupled capacitively, the input resistance of MOS transistors is infinite. There is neither resistive loading nor input current. The latter point is very useful for biasing considerations. Using this feature of infinite input resistance, input stages of analog subsystems can be made to have infinite input resistance. In addition, IGFET technologies, typically, have high precision IGFET capacitors with a small voltage coefficient. Finally, IGFET transistors can be used as near ideal switches by operating them between cutoff and linear regions of operation. Any analog system requiring switches and precision capacitors will benefit from having IGFET structures.

Bipolar transistors, on the other hand, have higher transconductance per collector current and per area. For analog circuits, generally, a DC bias current is flowing at all times. For a given supply voltage, the high transconductance per current translates into a higher transconductance per power. This, in turn, leads to the possibility of achieving a given performance at a lower power consumption with a smaller area using bipolar transistors. Bipolar circuits typically have higher frequency response, especially if the circuits are connected to any kinds of capacitive loads. In addition, bipolar transistors have higher intrinsic gain (arithmetic product of the transconductance and the output resistance). An intrinsic gain of a couple of thousands is easy to achieve using bipolar transistors, while it is difficult to achieve a couple of hundreds using IGFET transistors with a reasonable frequency response. Utilizing the higher transconductance per power and area, and the higher frequency response, a better driver can be made with bipolar transistors. Bipolar circuits also have a better matching and a smaller 1/f noise, which are crucial requirements for high precision circuits. For differential pairs of transistors, the offset voltage resulting from the mismatch of the transistor pair is inversely proportional to the ratio between transconductance and current. Because the bipolar transistors have a higher transconductance per current, the off-set voltage for bipolar differential pairs is lower than that of the IGFET pairs. In addition to this, IGFET transistors have additional mismatch due to the variations of the threshold voltage. This lower off-set voltage for bipolar differential pairs has already been exploited in the sense amplifiers of BICMOS Static RAMs to lower the voltage swing and the access time (Watanabe et al., "High Speed BICMOS VLSI Technology with Buried Twin Well Structure", *IEDM Tech. Digest*, p. 423, 1985).

SUMMARY OF THE INVENTION

The present invention comprises, in general, a merged bipolar IGFET and/or MOS transistor integrated circuit in which a vertical mesa-type bipolar transistor structure is formed in a substrate with an adjacent sidewall IGFET or MOS transistor using a BIMOS process.

In the merged BIMOS process of the invention, a vertical bipolar transistor is formed in a silicon island isolated by field oxide isolation regions. First, a silicon layer of one type conductivity is formed by ion implantation in the isolated island. This layer forms the collector for the bipolar transistor. Next, an opposite type conductivity silicon layer is selectively deposited on the collector. This layer is etched on both sides down to and through a portion of the collector forming a mesa-like structure with sidewalls. A p-n junction is exposed on the sidewalls. An oxide layer followed by a polysilicon or metal gate layer is formed over the structure and the gate layer is patterned leaving an insulated gate of polysilicon or metal over a portion of the sidewall and forming a semi-vertical IGFET or MOS precursor structure.

The structure is completed by ion implanting source and drain regions in the base and collector layers through the oxide layer. An emitter region is also formed in the base region to complete the bipolar portion of the merged transistor. The gate is used as a self-aligning mask for implanting the source and/or drain region(s).

A thin oxide layer, followed by a thick passivating dielectric layer, such as a borophosphosilicate glass (BPSG) film is then deposited on the structure and patterned with openings through which contact metallization is deposited and patterned to make contact with the MOS or IGFET and bipolar electrode regions.

In a preferred embodiment of the invention, an N-IGFET or N-MOS bipolar Darlington structure is formed by connecting the base with the source region using a butting contact.

The advantage of the merged bipolar/IGFET or MOS structure technology is that the area occupied by the structures is approximately the same as that of a bipolar transistor, while performing the functions of circuit elements composed of two transistors. This increase of functions for a given area is due to a decrease in the number of contacts as well as the number of wires to connect these contacts, and due to the three dimensional nature of these structures. The decrease in number of contacts and wires to connect these contacts also decreases the parasitic wiring and junction capacitances.

BRIEF DESCRIPTION OF THE DRAWINGS

FIGS. 1(a)–1(d) are a series of schematic cross-sections depicting the construction of a vertical bipolar n-p-n transistor with a merged NMOS sidewall transistor during successive stages of the process.

FIG. 2 is an equivalent circuit schematic of the structure of FIG. 1(d).

FIG. 4 is a schematic cross-sectional view of a merged bipolar n-p-n transistor and a P-MOS sidewall transistor embodiment.

FIG. 5 is an equivalent circuit schematic of the device of FIG. 4.

FIG. 6 is a schematic cross-sectional view of a merged bipolar n-p-n transistor and an N-MOS sidewall transistor.

FIG. 7 is an equivalent circuit schematic of the device of FIG. 6.

FIG. 8 is a schematic cross-sectional view of a merged bipolar vertical n-p-n transistor and N-MOS sidewall transistor with the base of the n-p-n transistor internally coupled to the n+ source.

FIG. 9 is an equivalent circuit schematic of the structure of FIG. 8.

DETAILED DESCRIPTION OF THE INVENTION

Figure 1C:
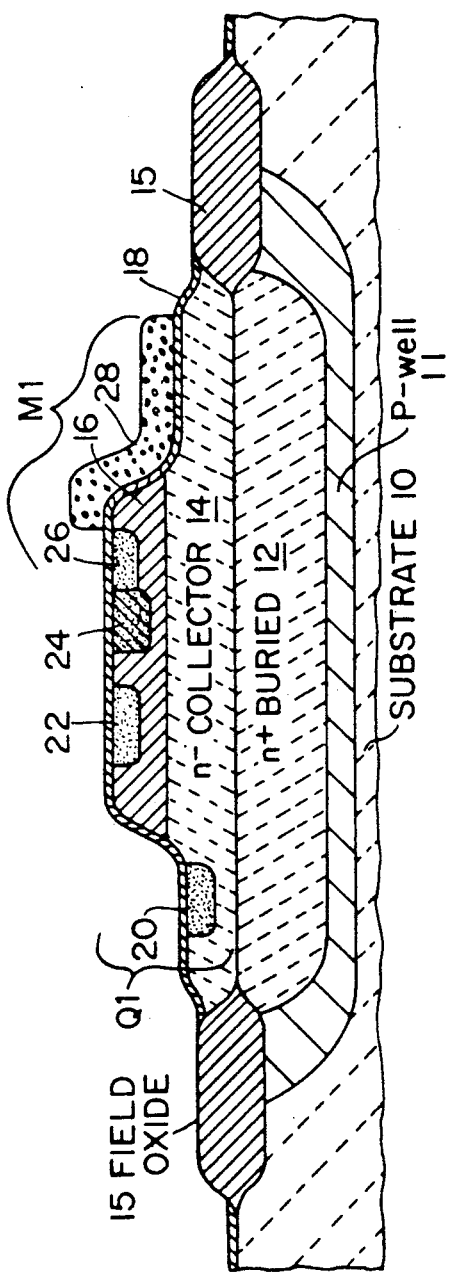

I. Merged Vertical Bipolar Transistor-Sidewall NMOS Transistor Embodiment

Referring now to FIGS. 1(a)-1(d), a first embodiment of the invention will now be described, in detail, in connection therewith. Note that while the term MOS has been used to describe the sidewall structure, technically speaking, since the gate is formed of polysilicon, the structure is more appropriately called an IGFET. For present purposes, the term MOS is meant to encompass either structure. In this embodiment, a vertical n-p-n bipolar silicon transistor structure Q1 [FIG. 1(c)] comprising collector 14, base 16 and emitter 22 is formed on a buried n+ Si layer 12 formed on a silicon p-well 11 contained in a Si substrate 10 [FIG. 1(d)]. In the process, an N-MOS sidewall transistor M1 [FIG. 1(c)] is merged with the bipolar transistor.

The BIMOS process steps begin with the formation of a suitable precursor structure, as shown in FIG. 1(a). The precursor structure consists of a Si p-well 11 formed in a p-Si substrate 10 by a local oxidation of silicon (LOCOS) process which utilizes a three layer oxidized nitride/nitride oxide mask (not shown) to produce a field oxide region 15 which laterally isolates a buried Si n+ region 12 from the other similar structures (not shown) on the rest of the substrate. The oxidized nitride and nitride portion of the mass is stripped, leaving the oxide 9.

Next, a second sacrificial thin nitride layer 17, about 100 nm thick, is deposited over the structure by low pressure chemical vapor deposition (LPCVD) followed by a 500 nm deposition of a low temperature oxide (LTO) layer 19. This layer sandwich 17/19 is then patterned to provide openings for doping of buried region 12. Arsenic (As) ions are implanted in the p-well 11 through the patterned oxide remaining from the LOCOS process. Preferably, the implantation and subsequent heat treatment parameters should be adjusted so that the field oxide (15)/p-well (11) interface is located deeper than the n+ (14)/p-well (15) junction. This forms a semi-dielectric device isolation structure for the vertical bipolar Si n-p-n transistors to follow. Next, the thin oxide over layer 12 (not shown) is removed and a selective epitaxial deposition of n− silicon layer 14 is performed between the openings in the patterned sandwich layer 17/19. A one micron thick silicon epitaxial layer 14 is grown only on the exposed silicon in preference to the surrounding LTO layer 19. This growth preferably occurs using a reduced pressure $SiH_2Cl_2$—$H_2$—HCl chemistry. The epitaxial layer 14 is then in situ doped with an n-type dopant, such as arsenic (As), to a concentration of $2 \times 10^{16}/cm^3$ to form n-collector layer 14, as shown in FIG. 1(a).

Depositing the selective epitaxial layer, rather than the conventional blanket epitaxial layer, saves a masking step. If the conventional epitaxial growth technique is used, then it would be necessary to remove the silicon from the areas other than those for the vertical bipolar structures. This requires an additional masking step, as well as an etch step.

The epitaxial film 14 is then oxidized to form oxide layer 21 and implanted with a p-type dopant, such as boron, to form the p-base layer 16 [See FIG. 1(b)]. During the base implantation, the active areas for the MOS structures are protected by the oxide/LTO-nitride sandwich 21/19/17. Following the patterning for the base 16, which is the second and the last added masking step, the selective epitaxial layer 14 is mesa etched to define the base area, and to uncover the base-collector junction 50 of the vertical n-p-n bipolar structure. Preferably, an isotropic plasma etch is used for the mesa etch to relieve the step coverage problems associated with formation of poly spacers during subsequent anisotropic etch steps. Having the LTO 19 and the nitride layer 17 over the field oxide 15 during the etch step makes the selectivity of the mesa etch over the oxide less critical. The spacings between the base areas and the edges of the selective epitaxial layer are kept at greater than 0.5 microns to make sure the base-collector junctions are free of defects associated with the edges of a selectively deposited epitaxial layer. Following the mesa etch step, the oxide 21 and LTO layers 14 are stripped. During this step, the nitride layer protects the field oxide layer. Following this, the nitride is stripped by using a wet or plasma etch. A gate oxide layer 18 is then formed over the structure followed by deposition of a gate layer 28, which may be polysilicon for an IGFET, or a metal, such as aluminum, or a refractory metal, such as tantalum or tungsten, or a silicide or alloy thereof for a MOS device [FIG. 1(b)].

The gate 28 is patterned over the sidewall. Next, all the n+ electrodes for the bipolar structure (the emitter 22 and the collector 20) are formed by arsenic ion implantation through the oxide layer 18.

Note that the n+ contact 20, along with the n− collector 14 in this embodiment, serve as the drain region for the sidewall MOS transistor M1. The n+ source region for the MOS transistor is also formed in this manner using the gate 28 as a self-aligning mask. In the embodiment of FIG. 1(c), the p+ base contact 24 of the n-p-n bipolar transistor is formed by boron ion implantation through the oxide mask and is formed in contact with the MOS source region.

For the NMOS sidewall transistor M1 of FIG. 1(c), the p-base layer 16 acts as the body.

The connection between p+ contact 24 and source region 26 ties the source and body 16 of the NMOS transistors together, as well as connecting the source region 26 with the p− base 16 of the bipolar transistor Q1. The n− and n+ layers 14 and 12 of vertical n-p-n transistor Q1 are used as both the collectors of the vertical n-p-n transistor, as well as the drain of the NMOS transistor.

To complete the process, following a light oxide coating (not shown), a passivating coating of BPSG is deposited over the structure and contact openings formed therein to the collector/drain contact 20, the emitter 22 and the source 26/base 24 and gate 28 through which contact metallization, such as Al-Si is deposited and patterned to form respective terminals 34, 32, 31 and 30.

Figure 1D:
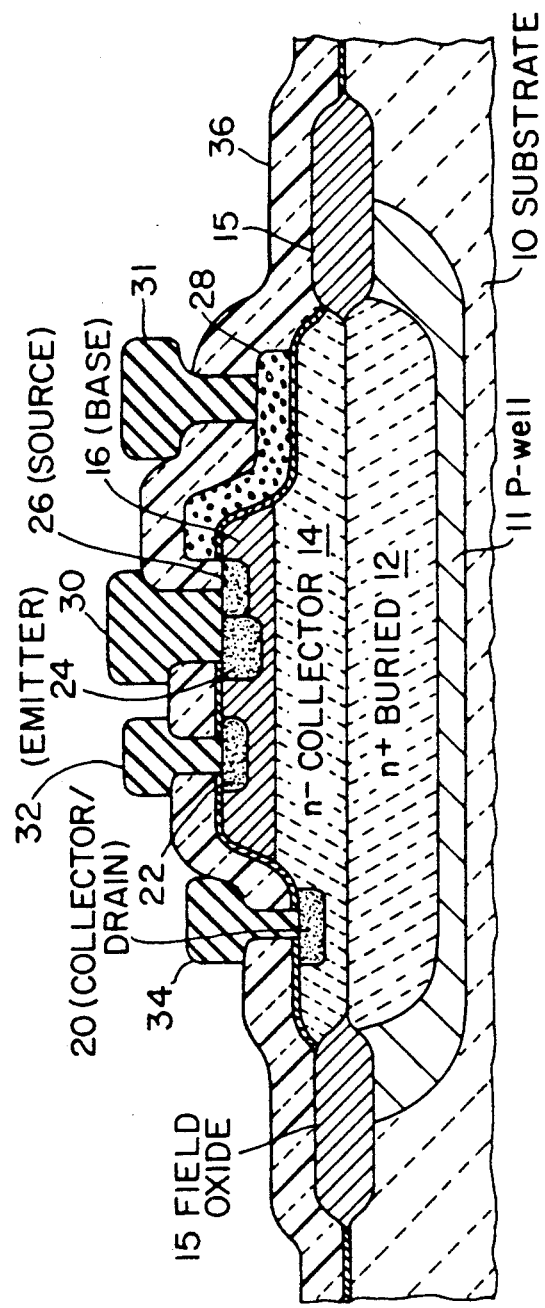
Figure 3A:
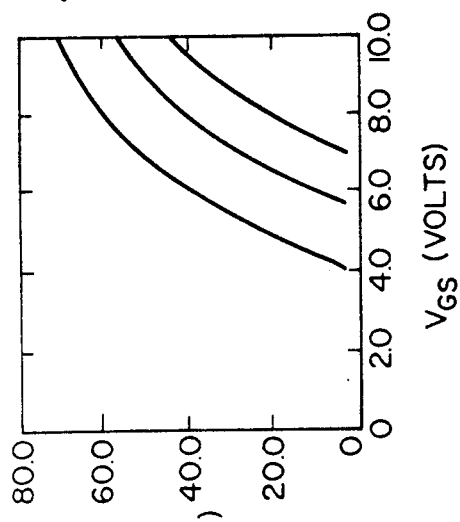
FIG. 3(a) is an $I_{CV}$ vs. $V_{CE}$ plot of the bipolar transistor portion of the sidewall NMOS-Bipolar Darlington transistor of FIG. 1(d).
Figure 3C:
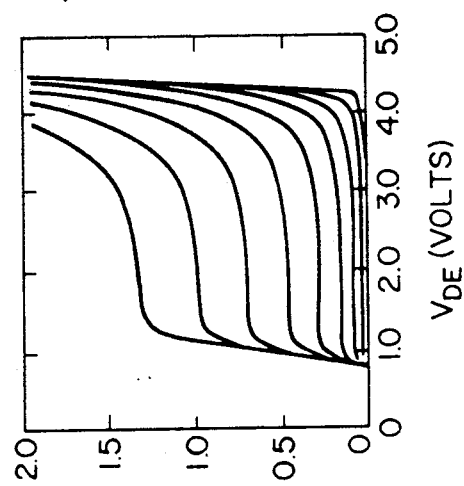
FIG. 3(c) is an $I_{DS}$ vs. $V_{GS}$ plot of the sidewall NMOS transistor portion of the sidewall NMOS-Bipolar Darlington transistor of FIG. 1(d).
Figure 3B:
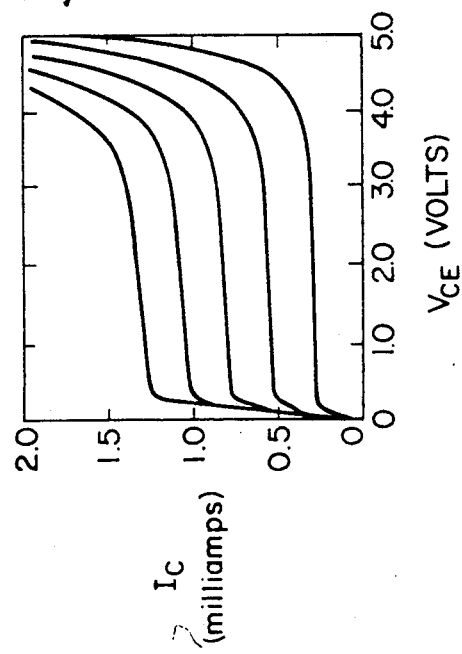
FIG. 3(b) is an $I_{DS}$ vs. $V_{DS}$ plot of the sidewall NMOS transistor portion of the sidewall NMOS-Bipolar Darlington transistor of FIG. 1(d).
Figure 3D:
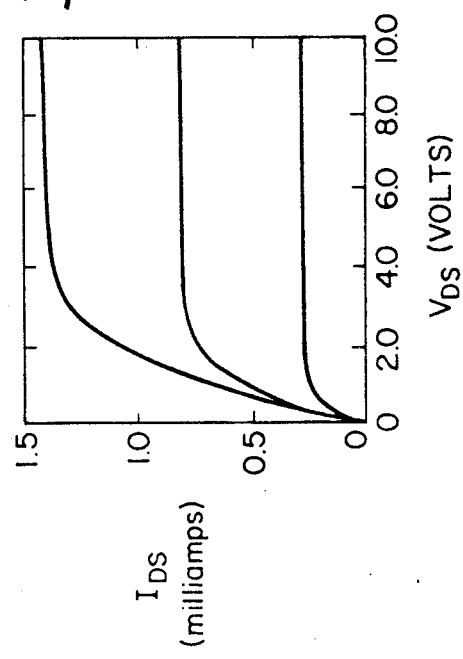
FIG. 3(d) is a plot of the merged drain/collector current Ic/ID versus $V_{DE}$ (with $V_{GE}$ as a parameter) curve of the NMOS-bipolar Darlington circuit of FIG. 1(d).

The equivalent circuit of FIG. 1(d) (which is a Darlington circuit with N-MOS input, is shown in FIG. 2 wherein G=gate, D=drain, S=source, B=base, C=collector and E=emitter. Experimental data for a polysilicon gate device constructed as above established that the addition of the sidewall MOS structure M1 did not change the bipolar characteristics of Q1, as shown in FIGS. 3a–3d. The drain-to-source current $I_{DS}$ vs. the drain-to-source voltage $V_{DS}$ characteristics for the sidewall NMOS transistor is very much like those of a planar NMOS transistor, except that the output resistance is higher for the sidewall NMOS transistor. The primary cause for this is the fact that the channel length modulation effect is reduced by having a drain structure which is composed of an n− layer on an n+ buried layer. The threshold voltage of an NMOS transistor M1 with a channel length of 2 microns was 4.0 V. The reason for this high threshold voltage is that a part of the NMOS channel is on the top of a mesa which has a high boron-doping concentration (approximately equal to $1 \times 10^{18}$ cm$^{-3}$) and the fact that the gate oxide thickness was not optimized. This problem can be eliminated by confining the channel to the sidewalls, which has a lower doping concentration, and by optimizing the gate oxide thickness. The merged drain/collector current versus the collector to emitter voltage/drain-to-emitter voltage [$V_{CE}/V_{DE}$] plots [with gate-to-emitter voltage ($V_{GE}$) as a parameter] FIG. 3(d), of the NMOS-bipolar Darlington circuit showed expected characteristics. These results demonstrate the concept and feasibility of fabricating the merged bipolar/sidewall MOS structures of the invention.

II. Merged Vertical Bipolar Transistor-Sidewall PMOS Transistor Embodiment

An alternate embodiment, made as previously described, is shown schematically in cross-section in FIG. 4, wherein items corresponding to items in FIG. 1(d) carry a prime suffix. In FIG. 4, a PMOS transistor M2 is merged with a vertical bipolar transistor Q2. The PMOS sidewall transistor M2 consists of a p+ source region 26' and p+ drain region 20' with a gate oxide insulator 18' and polysilicon gate electrode 28' and n− body 14'. The bipolar transistor Q2 consists of n− collector 14', p-base 16' and n− emitter 22'. The p+ region 20' in the base 16' serves the dual function of base contact for Q2 and drain for PMOS M2. By electrically connecting the p+ region 26' in the n− collector with the n+ collector contact 60, a BiMOS pull-up transistor is formed. The equivalent circuit diagram of this structure is shown in FIG. 5. Using this type of structures, it is possible to construct most of the BiMOS sub-circuit elements.

FIGS. 6–13 show examples of typical BiMOS sub-circuit elements which can be formed by using the teaching of the invention, as well as the equivalent circuit diagrams of these elements. These merged structures can also be formed on sidewalls of vertical p-n-p transistors with the same structural configurations as the vertical bipolar n-p-n transistors, by reversing the doping polarity.

FIG. 6 is a schematic cross-section view of an alternate embodiment of the invention in which a merged bipolar n-p-n transistor Q3 and an NMOS sidewall transistor M3 are incorporated in a single substrate comprising field oxide isolated n+ buried layer 12' on silicon substrate 11'. A mesa-like structure is formed in the substrate by etching away sidewalls 90 to expose a semiconductor junction 92. The structure is then coated with an oxide layer 18' and polysilicon layer formed over the oxide and patterned to provide a polysilicon gate electrode 28'. A p+ base contact 20', an n+ emitter source contact 22' and an n+ drain region 20' is formed by ion bombardment through the oxide layer using electrode 28' as a mask for aligning the source and drain regions 22' and 20', respectively. Following a brief oxide coating (not shown), a boro-phosphosilicate glass passivating layer 36' is formed over the structure. Openings are then formed in the BPSG layer to the base contact 20', the emitter source contact region 22' and the drain region 20' and metallization 30', 32' and 34' formed therein and poly-gate (not shown, since it is formed laterally adjacent in a different plane from the FIG. 6 cross-section).

In this embodiment, the emitter contact E and the source regions are common to one another, as shown in the equivalent circuit of FIG. 7, wherein the MOS source region S of M3 is coupled to the emitter E of the bipolar transistor Q3.

The embodiment of FIGS. 8 and 9 is similar to that of FIGS. 6 and 7 and therefore a detailed description of the common items will not be included herein.

In the FIGS. 8 and 9 structure, a merged bipolar vertical n-p-n transistor Q4 consisting of collector 14', base 16' and emitter 22' is formed as previously described. Here, however, the p+ base contact 24' is formed in contact with the n+ source region 26' of NMOS transistor M4 formed in the sidewall of the mesa-like structure. This is shown schematically in FIG. 9, wherein Q4 comprises the n-p-n bipolar transistor. The drain region 20' is formed in the collector layer 14' and the polysilicon gate electrode 28' is formed over the oxide insulator 18' on the sidewall, as previously described.

Figure 10:
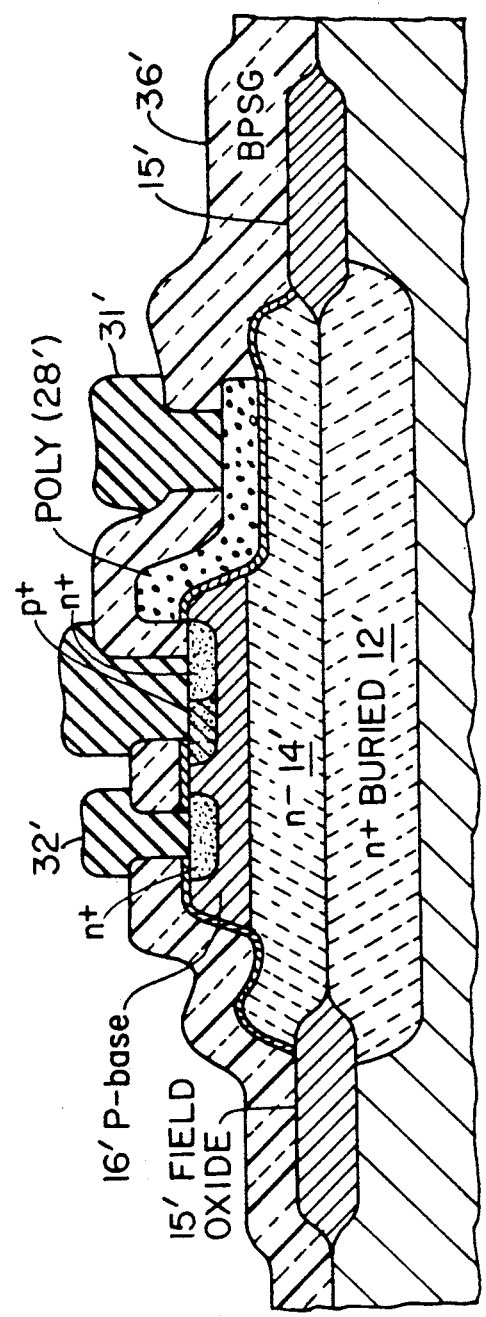
FIG. 10 is a cross-sectional schematic of a merged vertical bipolar n-p-n transistor and N-MOS sidewall transistor which is an alternate version to the structure of FIG. 8; showing how the polysilicon gate is metallized.

FIG. 10 depicts a structure, as in FIG. 8, except that the contact 31' to the gate 28' is shown.

Figure 11A:
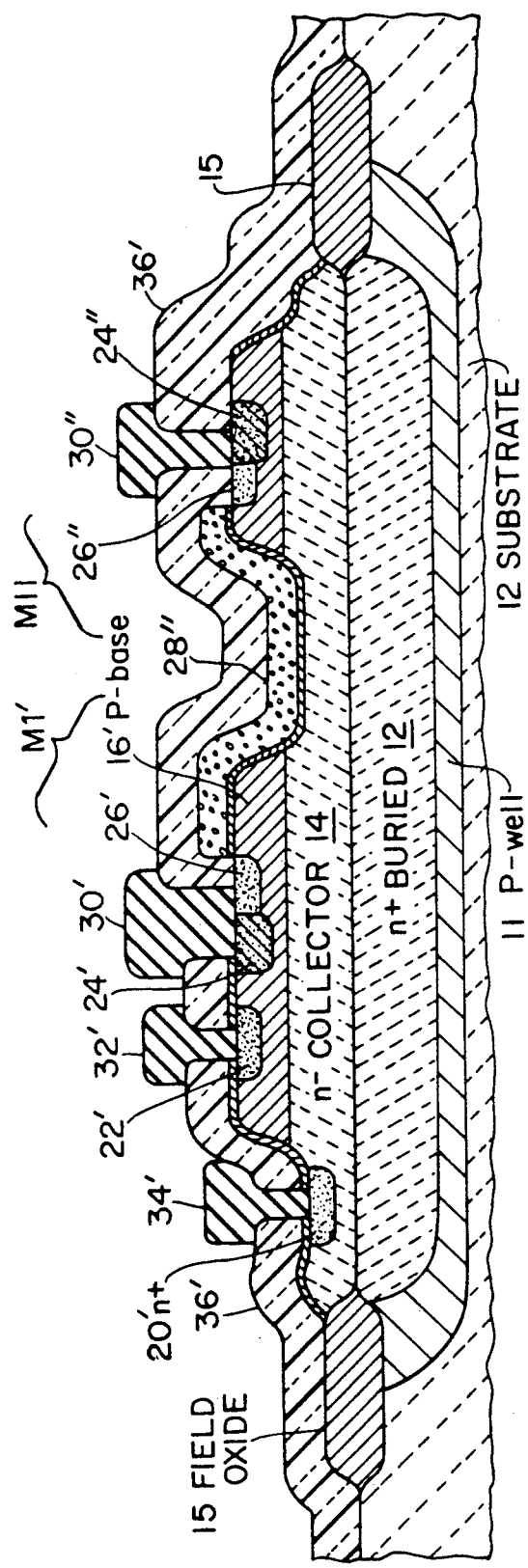
FIG. 11(a) is a cross-sectional schematic view of an alternate embodiment of FIG. 1(d) with an added sidewall N-MOS transistor to discharge the collector node.
Figure 11B:
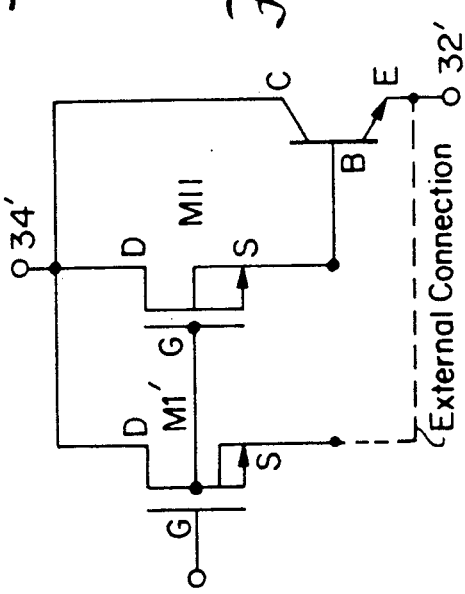
FIG. 11(b) is an equivalent circuit schematic of FIG. 11(a).

FIG. 11(a) is a cross-sectional view of an alternate embodiment of FIG. 1(d) in which a sidewall NMOS transistor M11 has been added to discharge the collector node of bipolar transistor Q1' [see equivalent circuit FIG. 11(b)]. The additional NMOS transistor M11 comprises common gate electrode 28'', source region 26'' with contact 30'', and common drain region 20' coupled with collector 14'.

Figure 12:
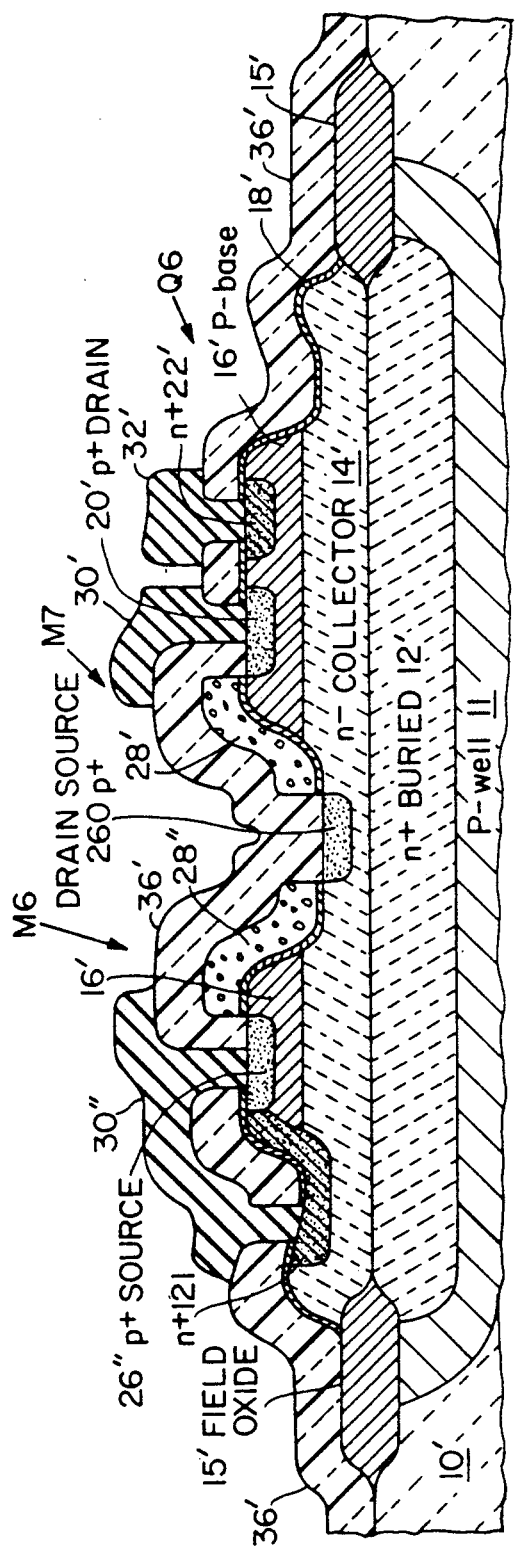
FIG. 12 is a cross-sectional schematic of a merged vertical bipolar n-p-n transistor with two P-MOS sidewall transistors.
Figure 13:
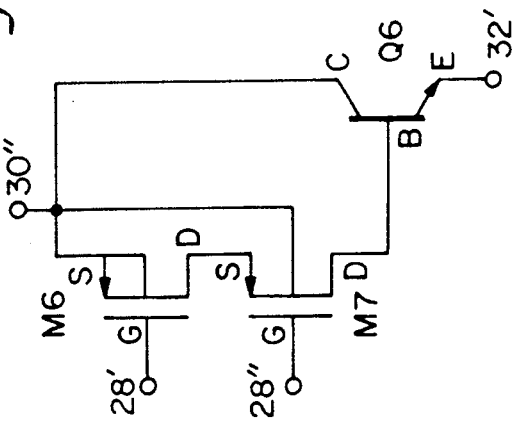
FIG. 13 is an equivalent circuit schematic of the structure of FIG. 12.

FIG. 12 depicts a cross-sectional schematic view of a merged vertical bipolar n-p-n transistor Q6 with two PMOS sidewall transistors, M6 and M7, formed in a single substrate comprising oxide isolated buried n+ layer 12' formed in P well 11' on substrate 10'. In this embodiment, as shown in equivalent circuit FIG. 13, the bipolar transistor is comprised of a collector 14', base 16' and emitter 22' with an emitter contact 32'. M6 is comprised of a p+ source region 26'', a gate electrode 28'' and a p+ drain region 260 formed in the n− collector 14'. Region 260 also serves as the source region for PMOS transistor M7, which is further comprised of gate electrode 28' and p+ drain 20'. The n region 121 serves as the collector contact of Q6 and body contact for M6.

Figure 14:
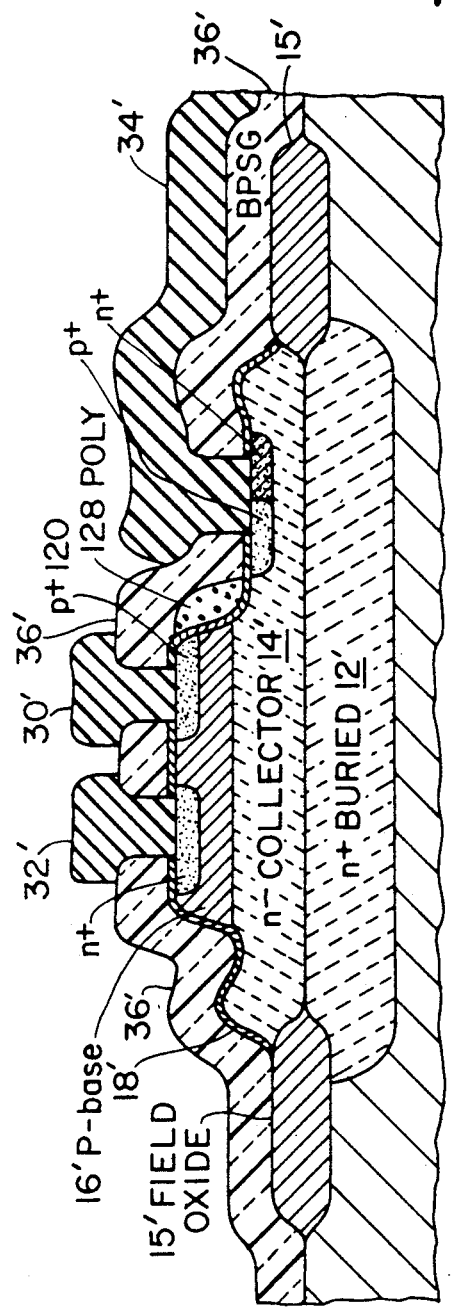
FIG. 14 is a cross-sectional schematic of an optimized version of FIG. 4 wherein the p+ drain region abuts the mesa wall.
Figure 15:
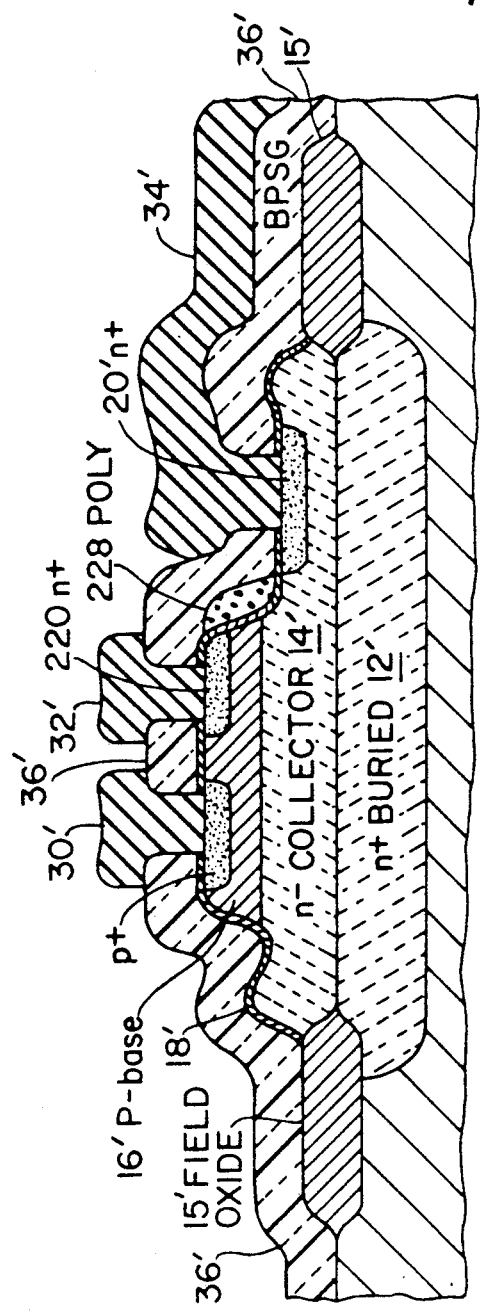
FIG. 15 is a cross-sectional schematic of an optimized version of FIG. 6 wherein the n+ drain region abuts the mesa sidewall.
Figure 16:
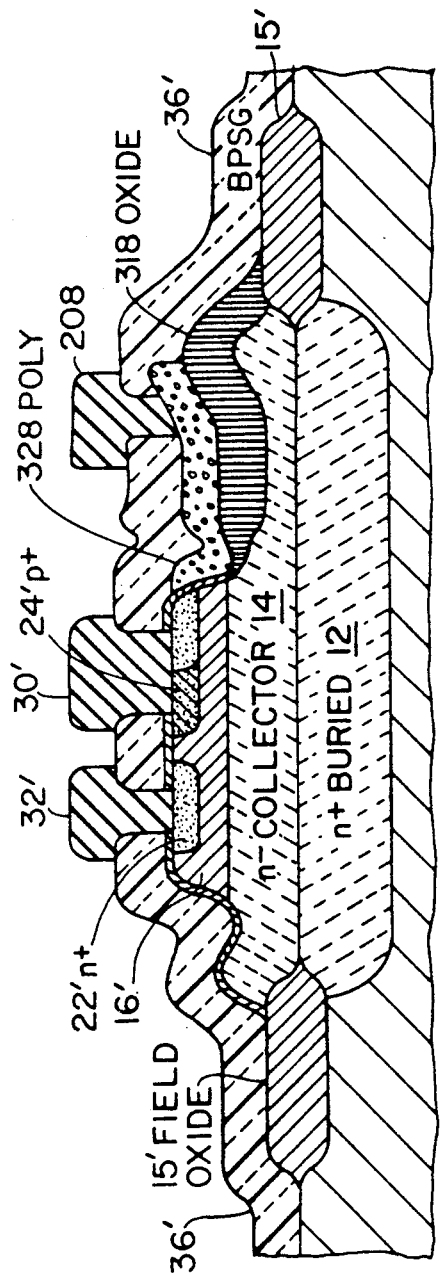
FIG. 16 is a cross-sectional schematic of an optimized version of FIG. 10 wherein a thick oxide layer is formed beneath the polysilicon gate.

More optimized versions of the structures shown in FIGS. 4, 6 and 10 of the invention are shown in FIGS. 14–16, respectively. FIG. 14 is a cross-sectional schematic of an optimized version of the PMOS structure of FIG. 4. In the embodiment of FIG. 14, the p+ drain region 220 of the MOS transistor is formed so as to abut the mesa wall.

Optimization is also achieved as shown in FIG. 15, for example, by having the n+ drain region 220' abut the mesa wall. For PMOS transistors (as in FIG. 14), this assures that the channel lengths of the MOS transistors are determined by the polysilicon layer width and the space between the base-collector junction and the bottom of the mesa, rather than by the overlay accuracy of the polysilicon layer to the mesa. For NMOS transistors (as in FIG. 15), abutting assures that the channel lengths are determined by the base width. As a consequence, it is possible to form very short channel MOS transistors. It is also desirable to make sure that the sidewall polysilicon gates 128 and 228 (FIGS. 14 and 15) do not extend onto the top of the mesa to minimize the topography, and the overlap capacitance. Finally, it is desirable to have a thick oxide layer 318 (FIG. 16) underneath the portion of polysilicon layer 328 which is not directly over the channel regions of the MOS transistors. This minimizes parasitic capacitance and parasitic transistor actions.

III. Alternative Selective Silicon Epitaxial Growth Process

In the embodiment shown in FIG. 1a, an epitaxial layer 14 is deposited on exposed silicon selectively over LTO (low temperature oxide) 19 and nitride 17 layers (i.e., no deposition occurs on top of the LTO layer 19).

The use of LTO and nitride layers, in addition to increasing the process complexity, roughens the edges of selective epitaxial islands. This is due to the deposition of non-single crystal silicon on the exposed nitride polysilicon layer during the epitaxial growth step, and the rough nature of non-single crystalline silicon deposited at typical silicon epitaxial layer deposition temperatures. The deposition of non-single crystalline silicon at the edges of selective epitaxial islands is one of the limiting factors which determine how closely the base-collector junctions can be placed from the edges of the selective epitaxial islands.

These problems can be avoided by depositing the selective epitaxial layer over the field oxide and thermally oxidized nitride grown during the field oxidation step, instead of over the LTO-nitride-oxide sandwich. Rather than stripping the LOCOS nitride layer 190 from everywhere after the field oxidation step, as in the previously described process, the nitride and underlying pad oxide layers are removed from the portions where the selective epitaxial layer is to be deposited in order to expose the silicon surface.

Figure 17:
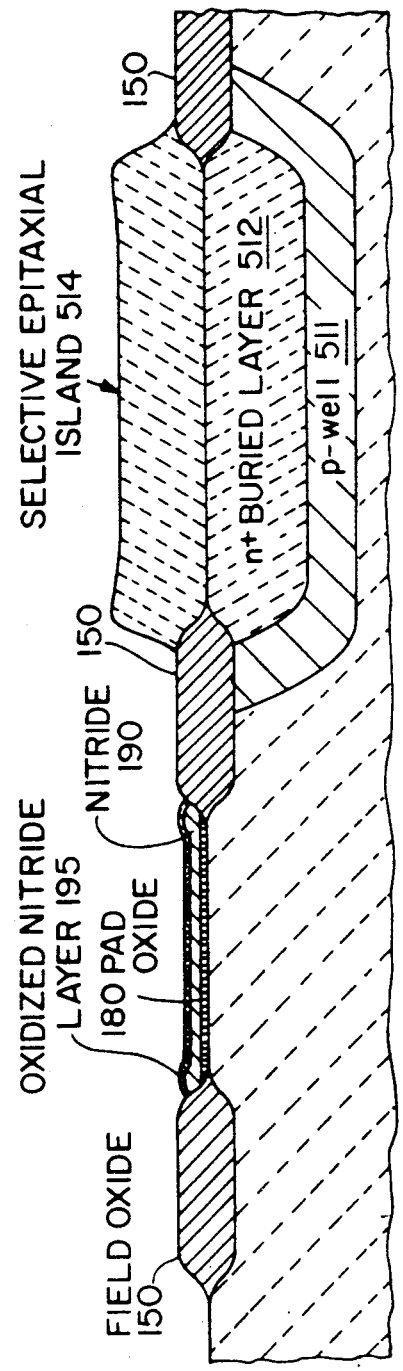
FIG. 17 is a schematic cross-sectional view illustrating an alternate method of selective epitaxy to form a precursor structure of the invention.

FIG. 17 illustrates this process. The field oxide 150 is formed by conventional LOCOS process consisting of formation of a pad oxide layer region 180, thin nitride layer region 190 on the pad oxide 180 and oxidized nitride layer regions 195 on the nitride 190. This three-layer sandwich 195/190/180 is dielectrically isolated by surrounding field oxide 150. We have found that to form a selective epitaxial island 514 in this isolated structure, it is not necessary to first strip the layers 195 and 190, provided certain precautions are taken to insure that the oxidized nitride layer 195 remains intact.

The pad oxide 180, nitride 190, oxidized nitride 195 is removed only from the location of island 514 using a photomask resist and suitable etchant. Following a standard pre-diffusion type chemical clean, and 10 second 50:1 HF dip, a selective epitaxial layer 140 is deposited on the exposed silicon surface. A cross-section after the selective epitaxial deposition is shown in FIG. 17.

In this process, following the selective epitaxial deposition of layer 140, base implantation, and base etch steps, the photo-resist mask used to define the mesa is removed in $O_2$ plasma and the nitride layer 195 is stripped in a hot mixture of phosphoric acid.

Care must be taken to protect the thin thermally oxidized nitride layer 195. If for some reason, the thermal oxide layer 195 on nitride layer 190 is removed, a thin (approximately 50 nm) CVD oxide can be deposited to cover the nitride for the selective epitaxial deposition.

The thin oxide layer 195 should be protected during the pre-epitaxial clean steps. This does not require any special processing steps, rather, it requires a care. The wafers should not be dipped in HF solutions for a prolonged period of time, which would remove the thin oxide layer and expose the nitride ($Si_3N_4$) layer 190. It was found that 10 second 50:1 HF dip is acceptable while 2 minute 10:1 HF dip is not. There are many combinations of HF concentration and time which will be acceptable, a careful characterization is needed to make sure a chosen HF treatment does not remove all the oxidized nitride layer. Using these guidelines, a successful selective epitaxial deposition over oxidized nitride and thermally grown oxide layer has been achieved. Initially, one of the concerns about depositing epitaxial layers selectively over an oxidized $Si_3N_4$ was the fact that this type of oxide layer is nitrogen rich; however, the successful selective epitaxial deposition has demonstrated that the impact of this effect is either negligible or can be overcome.

Yet another way to avoid non-single crystalline deposition at the edges is to re-optimize the selective epitaxial growth process, so that it is selective over nitride, as well as oxide. That is, it deposits on exposed silicon in preference to either nitride or oxide. For this approach, the protection of the oxidized nitride is not as critical. We have demonstrated that it is possible to selectively deposit epitaxial silicon on Si islands in preference over nitride or oxide by changing the ratio of HCL and $SiCl_2H_2$ flow rates using reduced pressure LPCVD.

In this approach, an epitaxial CVD reactor was employed using a pressure of 80 Torr, an HCl flow of 4 liters per minute, a $SiH_2Cl_2$ flow of 0.5 liters per minute, a $H_2$ flow of 133 liters per minute and a temperature of 1100° C.

The preferred selection etch for the mesa structure, which requires an etchant which is selective over oxide, is a plasma etcher operated under the following parameters:

|  |  | pressure | 500 mT |  |
|---|---|---|---|---|
|  |  | power | 50 W |  |
| Flow | { | SF6 | 95 sccm |  |
| Rate |  | He | 120 sccm |  |
|  |  | CCl4 | 3 sccm | (30 counts out of 1024 monitor the channel 1) |
|  |  | Gap | 1.5 cm |  |
|  |  | etch time | 50 sec |  |

The preferred base ion implantation specie for the process is boron at a 30 Kev energy level and TE13 dose.

Equivalents

While the above-described embodiments of the invention are preferred, other configurations will be readily apparent to those skilled in the art and thus the invention is only to be limited in scope by the language of the following claims and equivalents. For example, while the structure has been illustrated using Si as the semiconductor material, other materials, such as Ge, and III-V materials, such as GaAs, may be substituted therefore. Means other than ion implantation are contemplated for doping, such as diffusion. Isolation by means other than LOCOS may be substituted, such as a recessed oxidation process or mesa-isolation. The transistors may be of any appropriate polarity, i.e., n-p-n, or p-n-p, or N-MOS, or P-MOS.

We claim:

1. A plurality of merged vertical transistors and sidewall insulated gate transistor structures formed on a common substrate comprising:
    (a) a plurality of vertical transistors structures formed over an isolation region, which region is vertically and laterally electrically isolated from other portions of the common substrate and having at least:
        (i) a vertical transistor collector layer extending in a plane and formed of a first type conductivity semiconductor material;
        (ii) a vertical transistor base region formed of opposite type conductivity semiconductor material over said collector layer, said base region comprising an upper surface and a lower surface with sidewalls extending from said upper surface to said lower surface at an angle to said plane and wherein said collector layer is removed where one of said sidewalls intersects said plane to form a first mesa-like structure and expose a semiconductor junction at the intersection;
        (iii) an emitter region formed in said base region; and
    (b) an insulated gate transistor formed in and along one of said sidewalls and wherein the insulated gate transistor comprises a gate insulator formed on said sidewall and extending over said base region, a gate electrode formed on said gate insulator, a source region formed in said base region and extending laterally along said base region and a drain region formed in said collector layer.

2. The structure of claim 1 wherein the vertical transistor is an n-p-n transistor and the insulated gate transistor has n-type drain and source regions.

3. The structure of claim 1 wherein the vertical transistor is a n-p-n transistor and the insulated gate transistor has p-type drain and source regions.

4. The structure of claim 1 wherein a base contact is formed in the base region in contact with the source region of the insulated gate transistor.

5. The structure of claim 1 wherein the isolation region comprises a buried layer which is insulated from the substrate by a well of semiconductor material of opposite type conductivity to the conductivity of the buried layer, which layer is encircled by an insulator region.

6. The structure of claim 2 wherein region and emitter region are common to each other.

7. The structure of claim 3 including a second mesa-like structure formed in said collector layer and base region adjacent said first mesa-like structure with an exposed semiconductor junction and an insulated gate transistor formed in said second mesa-like structure.

8. The structure of claim 7 wherein the insulated gate transistor includes a p-type drain region in common with the source region of the insulated gate transistor formed in and along the first mesa-like structure.

9. The structure of claim 2 wherein the gate electrode extends over the top and bottom of the sidewall.

10. The structure of claim 3 wherein the gate electrode terminates at the top and bottom of the sidewall.

11. The structure of claim 4 wherein the source region abuts the sidewall of the mesa-like structure.

12. The structure of claim 7 wherein the insulated gate transistor formed in the second mesa-like structure includes a drain region in common with the drain region formed in said first mesa-like structure and the gate electrodes of each insulated gate transistor is in contact with each other while the source regions of each are coupled together via the base region of the vertical transistor.

13. A merged vertical transistor and insulated gate transistor device comprising:
    (a) first mesa-like semiconductor structure formed over a substrate and laterally and electrically vertically isolated therefrom; said structure having a top surface extending in a plane with sidewalls extending outwardly and downwardly from a central line passing orthogonally through the plane to intersect with said substrate;

(b) a semiconductor p/n junction extending to said sidewalls in a plane parallel with said top surface;

(c) a vertical transistor formed in said structure comprising:
  (i) a collector region at the bottom of said structure;
  (ii) a base region over said collector region forming said p/n junction with said collector region;
  (iii) and an emitter region in said base region; and (d) a first transistor formed in and along one of said sidewalls comprising:
  (i) a gate insulator extending along said sidewall and over said base region;
  (ii) a gate electrode over said insulator;
  (iii) a source region formed in said base region; and
  (iv) a drain region formed in said collector region.

14. The device of claim 13 including metal contacts formed on said source, emitter and drain regions and on said gate electrode.

15. The device of claim 13 wherein the mesa-like structure is formed of silicon, the collector region is formed of n-type doped silicon, the base region is formed of p-type doped silicon, the emitter region is formed of n-type doped silicon and the gate electrode is formed of polysilicon.

16. The device of claim 13 wherein a base contact is formed in the base region in contact with said source region.

17. The device of claim 16 wherein the source region is in contact with said sidewall.

18. The device of claim 13 further including a second mesa-like semiconductor structure with sidewalls formed on said substrate adjacent said first structure with a second transistor formed along a sidewall thereof.

19. The device of claim 18 wherein the second transistor has a gate electrode which extends to the gate electrode of the first transistor.

20. A merged vertical transistor and insulated gate transistor device comprising:

(a) a first mesa-like semiconductor structure formed over a substrate and laterally and vertically electrically isolated therefrom; said structure having a top surface extending in a plane with sidewalls extending outwardly and downwardly from a central line passing orthogonal through the plane to intersect with said substrate;

(b) a semiconductor p/n junction extending to said sidewalls in a plane parallel with said top surface;

(c) a vertical transistor formed in said structure comprising:
  (i) a collector region at the bottom of said structure;
  (ii) a base region over said collector region forming said p/n junction with said collector region;
  (iii) and an emitter region in said base region; and (d) a first transistor formed in and along one of said sidewalls comprising:
  (i) a gate insulator extending along said sidewall;
  (ii) a gate electrode over said insulator;
  (iii) a source region formed in said base region and extending laterally up to, but not underlying, said gate insulator; and
  (iv) a drain region formed in said base region.

21. The device of claim 20 having a separate emitter electrode formed on said emitter region.

22. The device of claim 13 having a separate emitter electrode formed on said emitter region.

* * * * *

UNITED STATES PATENT AND TRADEMARK OFFICE
CERTIFICATE OF CORRECTION

PATENT NO. : 5,028,977

DATED : July 2, 1991

INVENTOR(S) : Kenneth K. O, Hae-Seung Lee and L. Rafael Reif

It is certified that error appears in the above-identified patent and that said Letters Patent is hereby corrected as shown below:

On the title page, Item [75], delete "K. O. Kenneth" and insert --Kenneth K. O--.

On the title page, Item [19], delete "K. O. Kenneth et al" and insert --O, et al Col. 10, line 39, after "wherein" insert --the source--.

Col. 11, line 3, delete "orthogonally" and insert --orthogonal--.

Signed and Sealed this

Thirteenth Day of October, 1992

*Attest:*

DOUGLAS B. COMER

*Attesting Officer*  *Acting Commissioner of Patents and Trademarks*